United States Patent
Kim et al.

(10) Patent No.: US 10,628,265 B2
(45) Date of Patent: Apr. 21, 2020

(54) DATA BACKUP METHOD FOR PERFORMING POST PACKAGE REPAIR (REPAIR ON SYSTEM) OPERATION

(71) Applicant: SAMSUNG ELECTRONICS CO., LTD., Suwon-si, Gyeonggi-do (KR)

(72) Inventors: Dae-Jeong Kim, Seoul (KR); Yoenhwa Lee, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/805,622

(22) Filed: Nov. 7, 2017

(65) Prior Publication Data
US 2018/0173595 A1 Jun. 21, 2018

(30) Foreign Application Priority Data
Dec. 16, 2016 (KR) .................. 10-2016-0172820

(51) Int. Cl.
| | | |
|---|---|---|
| G11C 29/00 | (2006.01) | |
| G06F 11/14 | (2006.01) | |
| G11C 29/44 | (2006.01) | |
| G11C 29/42 | (2006.01) | |
| G11C 14/00 | (2006.01) | |
| G11C 17/16 | (2006.01) | |
| G11C 29/04 | (2006.01) | |

(52) U.S. Cl.
CPC ...... *G06F 11/1458* (2013.01); *G06F 11/1448* (2013.01); *G11C 29/00* (2013.01); *G11C 29/42* (2013.01); *G11C 29/4401* (2013.01); *G11C 14/0018* (2013.01); *G11C 17/16* (2013.01); *G11C 2029/0407* (2013.01); *G11C 2029/4402* (2013.01); *G11C 2229/743* (2013.01)

(58) Field of Classification Search
CPC .. G06F 11/1458; G06F 11/1448; G11C 17/16; G11C 29/00; G11C 14/0018; G11C 2229/743

See application file for complete search history.

(56) References Cited

U.S. PATENT DOCUMENTS

| | | | |
|---|---|---|---|
| 6,535,438 B2 | 3/2003 | Ariki | |
| 8,634,263 B2 | 1/2014 | Kenkare et al. | |
| 9,202,595 B2 | 12/2015 | Wilson et al. | |
| 9,269,459 B2 | 2/2016 | Adham et al. | |
| 9,349,491 B1 * | 5/2016 | Morgan | G11C 29/76 |
| 9,418,762 B1 * | 8/2016 | You | G11C 29/78 |
| 9,437,330 B2 | 9/2016 | Park et al. | |
| 9,449,673 B2 | 9/2016 | Seo | |
| 9,556,851 B2 | 1/2017 | Wilson et al. | |
| 2008/0094893 A1 * | 4/2008 | Choi | G06F 11/1072 365/185.03 |

(Continued)

*Primary Examiner* — Khamdan N. Alrobaie
(74) *Attorney, Agent, or Firm* — F. Chau & Associates, LLC

(57) ABSTRACT

A data backup method for performing a post package repair (PPR) operation includes reading repair unit information of a memory device, storing the repair unit information in a register, determining whether to perform the PPR operation in response to a read error occurring while the memory device is being accessed, and performing a data backup operation of the memory device based on the repair unit information in response to determining that the PPR operation is to be performed.

18 Claims, 14 Drawing Sheets

(56) References Cited

U.S. PATENT DOCUMENTS

| | | | |
|---|---|---|---|
| 2010/0169705 A1* | 7/2010 | Fujii | G11C 29/44 714/6.12 |
| 2015/0109848 A1* | 4/2015 | Adham | G11C 17/146 365/96 |
| 2015/0187436 A1 | 7/2015 | Querbach et al. | |
| 2016/0062819 A1 | 3/2016 | Oh et al. | |
| 2016/0078968 A1* | 3/2016 | Park | G11C 29/78 365/96 |
| 2017/0068607 A1* | 3/2017 | Herzi | G06F 13/24 |
| 2017/0133108 A1* | 5/2017 | Lee | G11C 29/76 |
| 2017/0185499 A1* | 6/2017 | Lee | G06F 11/2094 |
| 2017/0192843 A1* | 7/2017 | Warnes | G11C 29/06 |

* cited by examiner

FIG. 11

| CH1 ||| Data Backup Unit | RUI |
|---|---|---|---|---|
| DIMM1 | DIMM2 | DIMM3 | | |
| 1WL | 1WL | 1WL | 512B | 01 |
| 2WL | 2WL | 2WL | 1KB | 10 |
| 4WL | 4WL | 4WL | 2KB | 11 |
| 1WL | 1WL | 2WL | 1KB | 10 |
| 1WL | 2WL | 4WL | 2KB | 11 |

DATA BACKUP METHOD FOR PERFORMING POST PACKAGE REPAIR (REPAIR ON SYSTEM) OPERATION

CROSS-REFERENCE TO RELATED APPLICATIONS

This application claims priority under 35 U.S.C. § 119 to Korean Patent Application No. 10-2016-0172820, filed on Dec. 16, 2016, the disclosure of which is incorporated by reference herein in its entirety.

TECHNICAL FIELD

Exemplary embodiments of the inventive concept relate to a data backup method of a data system, and more particularly, to a data backup method for a post package repair (PPR) operation (also referred to as a repair on system (ROS) operation).

DISCUSSION OF THE RELATED ART

An electronic system such as a computer, a smartphone, a tablet, a server, a workstation, etc. may include a data system that processes data necessary for system operation. The data system may include a memory device, such as a dynamic random access memory (DRAM) device, that stores data. The processes performed during the manufacture of such a memory device may include a process of repairing defective memory cells. In the repair process, defective memory cells in the memory device may be replaced with spare memory cells. To efficiently perform such a repair process, a word line to which defective memory cells are connected may be repaired together with word lines that do not include a defective memory cell. For example, in the case where a repair unit is x4, in addition to repairing a word line that includes a defective memory cell, three adjacent three word lines that do not include a defective memory cell may also be repaired.

A memory device may be repaired after it is packaged, and while the data system operates, in a post package repair (PPR) operation (also referred to as a repair on system (ROS) operation). When performing a PPR operation, a data backup operation is performed before the PPR operation to prevent data loss. The data backup operation may include moving the entirety of the data stored in a memory module to another memory module, which may take a large amount of time.

SUMMARY

According to an exemplary embodiment of the inventive concept, a data backup method for performing a post package repair (PPR) operation includes reading repair unit information of a memory device, storing the repair unit information in a register, determining whether to perform the post package repair (PPR) operation in response to a read error occurring while the memory device is being accessed, and performing a data backup operation of the memory device based on the repair unit information in response to determining that the post package repair operation is to be performed.

According to an exemplary embodiment of the inventive concept, a data backup method for performing a PPR operation includes reading repair unit information of a memory device during a booting up mode of a data system, storing the repair unit information in a memory in a controller, determining whether a read error occurring while the memory device is being accessed is correctable using an error correction code (ECC), and performing a data backup operation of the memory device on a per-channel basis based on the repair unit information stored in the memory in response to determining that the read error occurring while the memory device is being accessed is not correctable using the ECC.

According to an exemplary embodiment of the inventive concept, a data backup method for performing a PPR operation includes reading repair unit information of a memory device, storing the repair unit information in a register, determining whether a read error occurring while the memory device is being accessed is correctable using an error correction code (ECC), and performing a data backup operation of the memory device based on the repair unit information in response to determining that the read error occurring while the memory device is being accessed is not correctable using the ECC.

BRIEF DESCRIPTION OF THE DRAWINGS

The above and other features of the inventive concept will become more apparent by describing in detail exemplary embodiments thereof with reference to the accompanying drawings, in which:

FIG. 11 is a view illustrating repair unit information used in a data backup operation according to exemplary embodiments of the inventive concept.

DETAILED DESCRIPTION OF THE EXEMPLARY EMBODIMENTS

Figure 1:
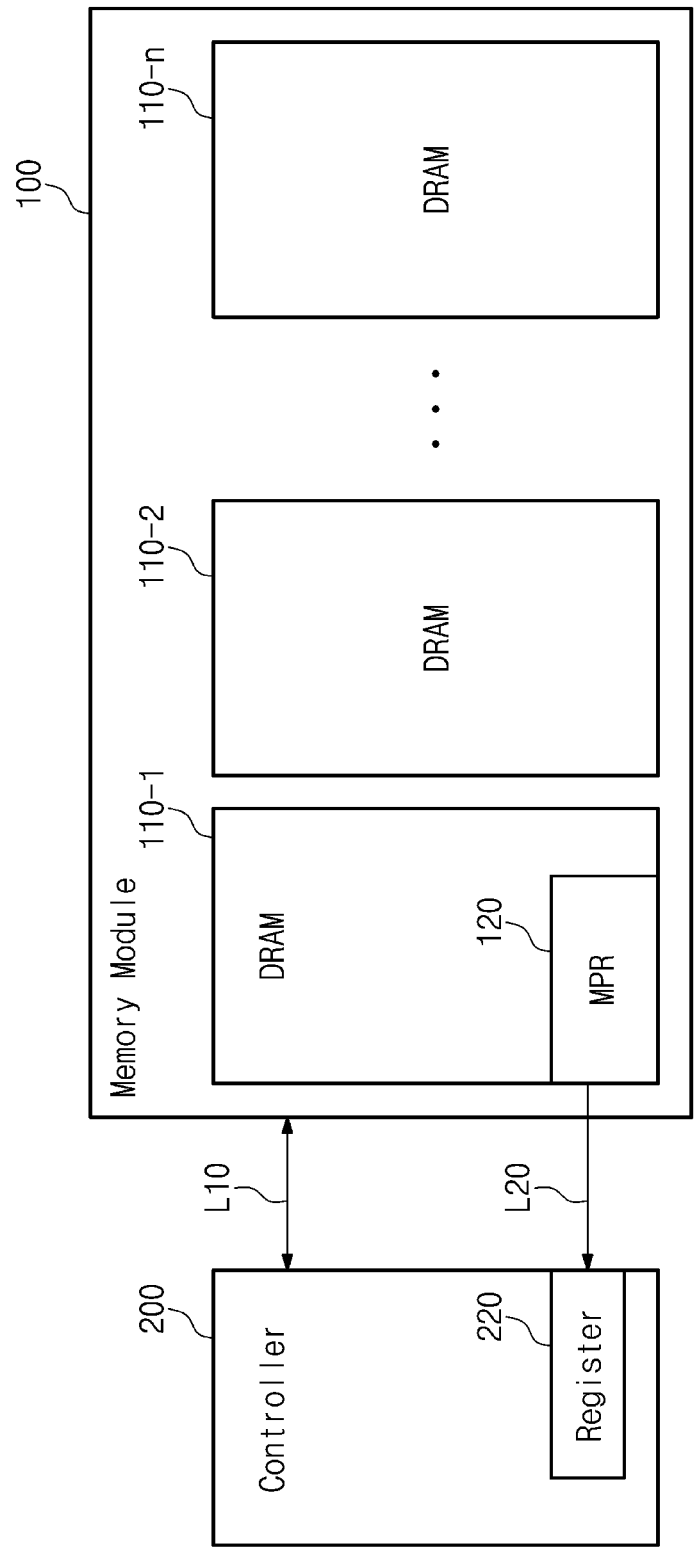
FIG. 1 is a view illustrating a data system according to exemplary embodiments of the inventive concept.

Exemplary embodiments of inventive concept will be described more fully hereinafter with reference to the accompanying drawings. Like reference numerals may refer to like elements throughout the accompanying drawings.

FIG. 1 is a view illustrating a data system according to exemplary embodiments of the inventive concept. Referring to FIG. 1, the data system includes a memory module 100 and a controller 200.

The memory module 100 may include a plurality of memory devices (110-1, 110-2, . . . , 110-n). The memory module 100 may be, for example, a DIMM (dual in-line memory module), an RDIMM (registered dual in-line memory module), a UDIMM (unbuffered dual in-line memory module), a SODIMM (small outline dual in-line memory module), or an ECC-SODIMM (error check & correction small outline dual in-line memory module). However, the memory module 100 is not limited thereto.

Each of the plurality of memory devices (110-1, 110-2, . . . , 110-n) in the memory module 100 may be, for example, a dynamic random access memory (DRAM). The DRAM (e.g., 110-1) may be mounted on a substrate of the memory module 100 in individual chip form. The DRAM (e.g., 110-1) may include a multi-purpose register (MPR) 120. The MPR 120 may store repair unit information. The repair unit information may be used when performing a data backup for a post package repair (PPR) operation (also referred to as a repair on system (ROS) operation).

The controller 200 is connected to the memory module 100 through lines (L10, L20). The line L10 is a line through which an address, a command, and data are provided. The line L20 is a line through which repair unit information according to exemplary embodiments of the inventive concept is provided. The line L20 is illustrated for convenience of explanation, and the repair unit information may be provided as data through the line L10.

The controller 200 may be embodied by a memory controller, a chip set, a CPU, or a microprocessor. The controller 200 may include a register 220. The register 220 may include the repair unit information. The repair unit information stored in the register 220 is information read from the MPR 120 of the DRAM (e.g., 110-1).

In exemplary embodiments, the controller 200 may include an ECC (error correction code) circuit. The ECC circuit may perform an ECC operation of detecting an error or correcting the detected error. A parity bit may be used to perform an ECC operation.

Figure 2:
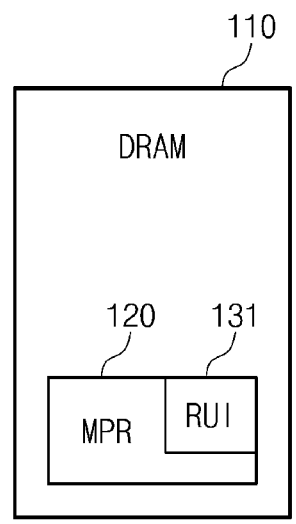
FIG. 2 is a block diagram illustrating a memory device in a memory module of FIG. 1 according to exemplary embodiments of the inventive concept.

FIG. 2 is a block diagram illustrating a memory device in a memory module of FIG. 1 according to exemplary embodiments of the inventive concept. Referring to FIG. 2, the DRAM 110 may include the MPR 120. The MPR 120 includes a repair unit information (RUI) area 131. Repair unit information (RUI) is stored in the RUI area 131. The repair unit information (RUI) may be constituted by, for example, 2-bit data or 3-bit data. In the case where the repair unit information is constituted by 2-bit data, data "11" may indicate that a repair unit is x4, data "10" may indicate that a repair unit is x2, and data "01" may indicate that a repair unit is x1. However, exemplary embodiments of the inventive concept are not limited thereto.

Figure 3:
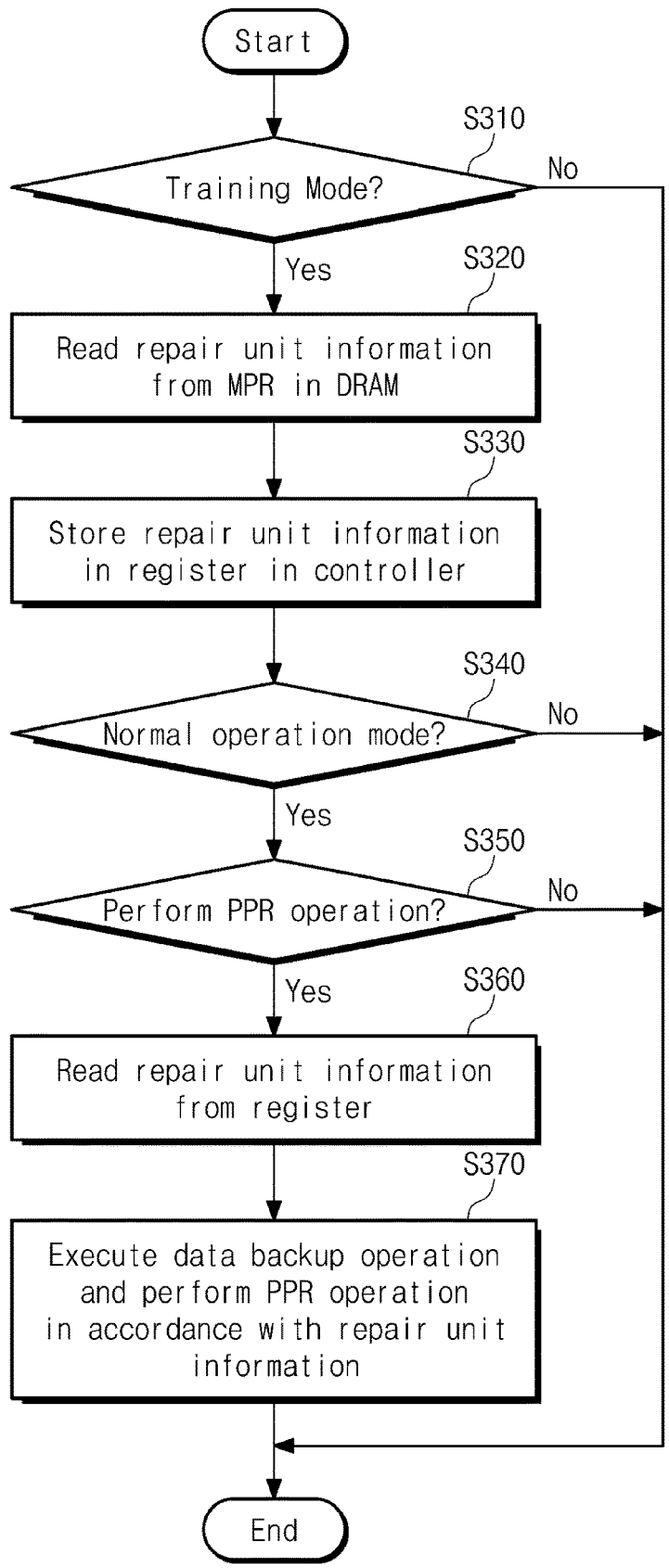
FIG. 3 is a flowchart illustrating a data backup operation of the controller of FIG. 1 according to exemplary embodiments of the inventive concept.

FIG. 3 is a flowchart illustrating a data backup operation of the controller of FIG. 1 according to exemplary embodiments of the inventive concept. Referring to FIG. 3, in operation S310, the controller 200 determines whether the data system is in a training mode. The training mode may be performed when the data system is powered on or is suddenly powered off. The training mode may be periodically performed while the data system operates.

In the case where the data system is in the training mode, in operation S320, the controller 200 reads repair unit information from the memory module 100. For example, the controller 200 may read the repair unit information from the RUI area 131 in the MPR 120 of the DRAM (e.g., 110-1).

In operation S330, the controller 200 stores the repair unit information read from the RUI area 131 in the register 220 in the controller 200.

In operation S340, the controller 200 determines whether the data system is in a normal operation mode. The normal operation mode includes operation modes other than the training mode. For example, an operation of reading data from the memory module 100 or an operation of writing data in the memory module 100 may be included in the normal operation.

In the case where the data system is in the normal operation mode, in operation S350, the controller 200 determines whether to perform a post package repair (PPR) operation. The post package repair (PPR) operation is performed after the memory module 100 has been packaged in a memory device, and may also be referred to as a repair on system (ROS) operation. That is, in operation S350, it is determined whether the post package repair (PPR) operation is to be performed. For example, when a read error occurs in a read operation, it may be determined whether the post package repair (PPR) operation is to be performed. In exemplary embodiments, in the case where read errors that occurred cannot be corrected using an ECC (error correction code), it is determined that the post package repair (PPR) operation is to be performed. For example, when a read error occurs, if the read error can be corrected using an ECC, an ECC is used to correct the read error and the post package repair (PPR) operation is not performed. Otherwise, if the read error cannot be corrected using an ECC, the post package repair (PPR) operation is performed.

A data backup operation is performed before the post package repair (PPR) operation is performed. Thus, when it is determined that the post package repair (PPR) operation is to be performed, the controller 200 reads repair unit information from the register 220 in operation S360, and performs a data back operation and performs the post package repair (PPR) operation based on the repair unit information in operation S370. The data backup operation of the memory module 100 may be performed according to channels. The data backup operation of the memory module 100 may be partly performed and will be described later.

The control operations described in FIG. 3 may be implemented by various means depending on applications. For example, the control operations may be implemented in hardware, firmware, software, or combinations thereof. When the control operations are implemented in hardware, processing units may be embodied by ASICs (application specific integrated circuit), DSPs (digital signal processor), DSPDs (digital signal processor device), PLDs (programmable logic device), FPGAs (field programmable gate array), processors, controllers, micro-controllers, microprocessors, electronic devices, other electronic units designed to perform functions described in the specification of the inventive concept, or combinations thereof.

Figure 4:
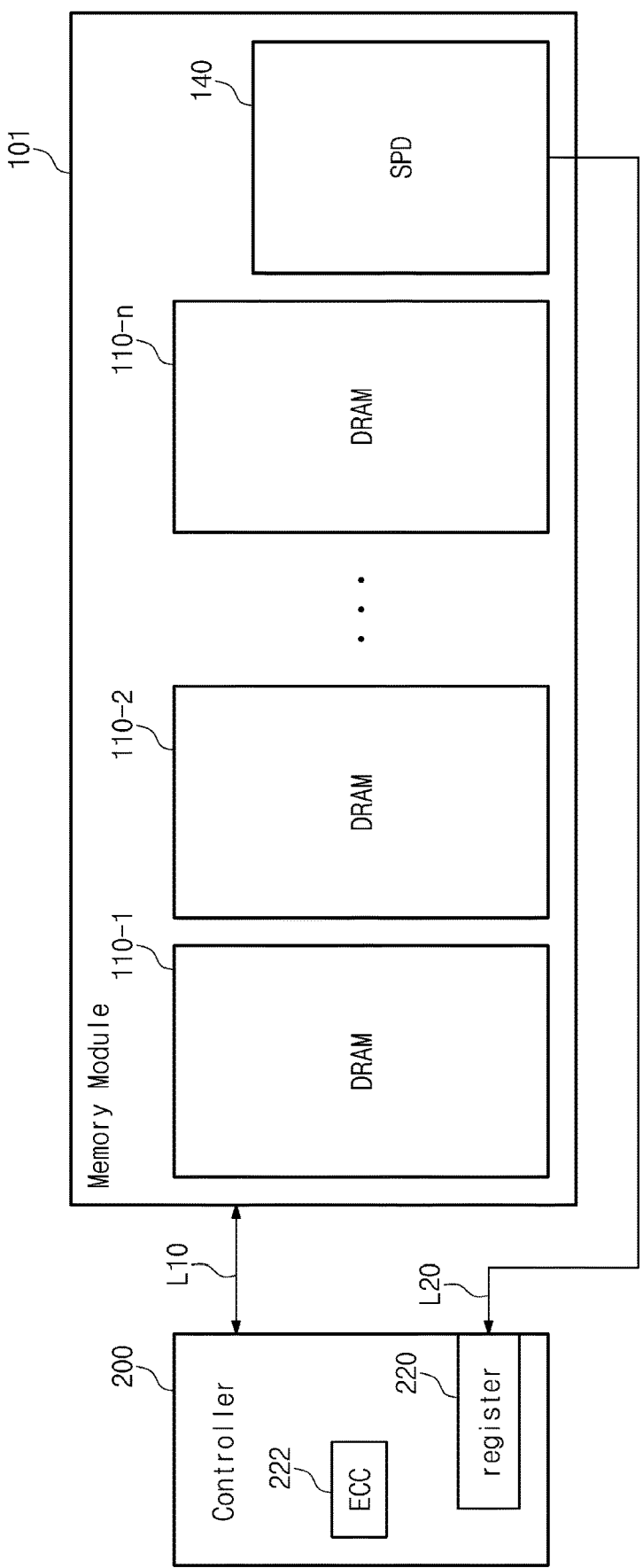
FIG. 4 is a view illustrating a data system according to exemplary embodiments of the inventive concept.

FIG. 4 is a view illustrating a data system according to exemplary embodiments of the inventive concept.

Referring to FIG. 4, the data system includes a memory module 101 and a controller 200.

The memory module 101 may include a plurality of memory devices (110-1, 110-2, . . . , 110-n) and a serial presence detect (SPD) memory 140. The memory module 101 may be, for example, a dual in-line memory module (DIMM).

Each of the plurality of memory devices (110-1, 110-2, . . . , 110-n) in the memory module 101 may be a dynamic random access memory (DRAM). The DRAM (e.g., 110-1) may be mounted on a PCB (printed circuit board) of the memory module 101 in an individual chip form.

The serial presence detect (SPD) memory 140 may be mounted on a PCB (printed circuit board) of the memory module 101 in an individual chip form. The serial presence detect (SPD) memory 140 may be embodied by a nonvolatile semiconductor memory such as an EEPROM (electrically erasable and programmable read only memory). Repair unit information may be stored in an area set in the serial presence detect (SPD) memory 140. The repair unit information may be used in a data backup for a post package repair (PPR) operation.

The controller 200 is connected to the memory module 100 through lines (L10, L20). The line L10 is a line through which an address, a command, and data are provided. The line L20 is a line through which the repair unit information is provided. However, the line L20 is illustrated for convenience of explanation, and the repair unit information may be provided as data through the line L10.

The controller 200 may include a register 220 and an ECC circuit 222. The register 220 may store the repair unit information. The repair unit information stored in the register 220 is information read from the SPD memory 140 in the memory module 101.

The ECC circuit 222 performs an ECC operation of detecting an error or correcting the detected error. Parity bits may be used to perform the ECC operation. In an exemplary scenario, in the case where the ECC operation detects and corrects a 1-bit error among 64-bit data bits, 8-bit parity bits may be used. A code word may be formed by adding the 64-bit data bits and the 8-bit parity bits together. Consequently, one code word may be constituted by 72 bits and in the ECC operation, [72, 64] Hamming code may be used with respect to one code word. In this case, if the number of error bits in the one code word is two or more, an error cannot be recovered by the ECC operation.

Figure 5:
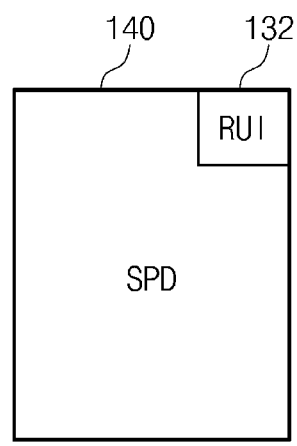
FIG. 5 is a block diagram illustrating a SPD memory in a memory module of FIG. 4 according to exemplary embodiments of the inventive concept.

FIG. 5 is a block diagram illustrating a SPD memory in a memory module of FIG. 4 according to an exemplary embodiment of the inventive concept.

Referring to FIG. 5, the SPD memory 140 includes a RUI area 132. Repair unit information (RUI) is stored in the RUI area 132. The repair unit information (RUI) may be constituted by, for example, 2-bit data or 3-bit data similar to the description in FIG. 2.

Figure 6:
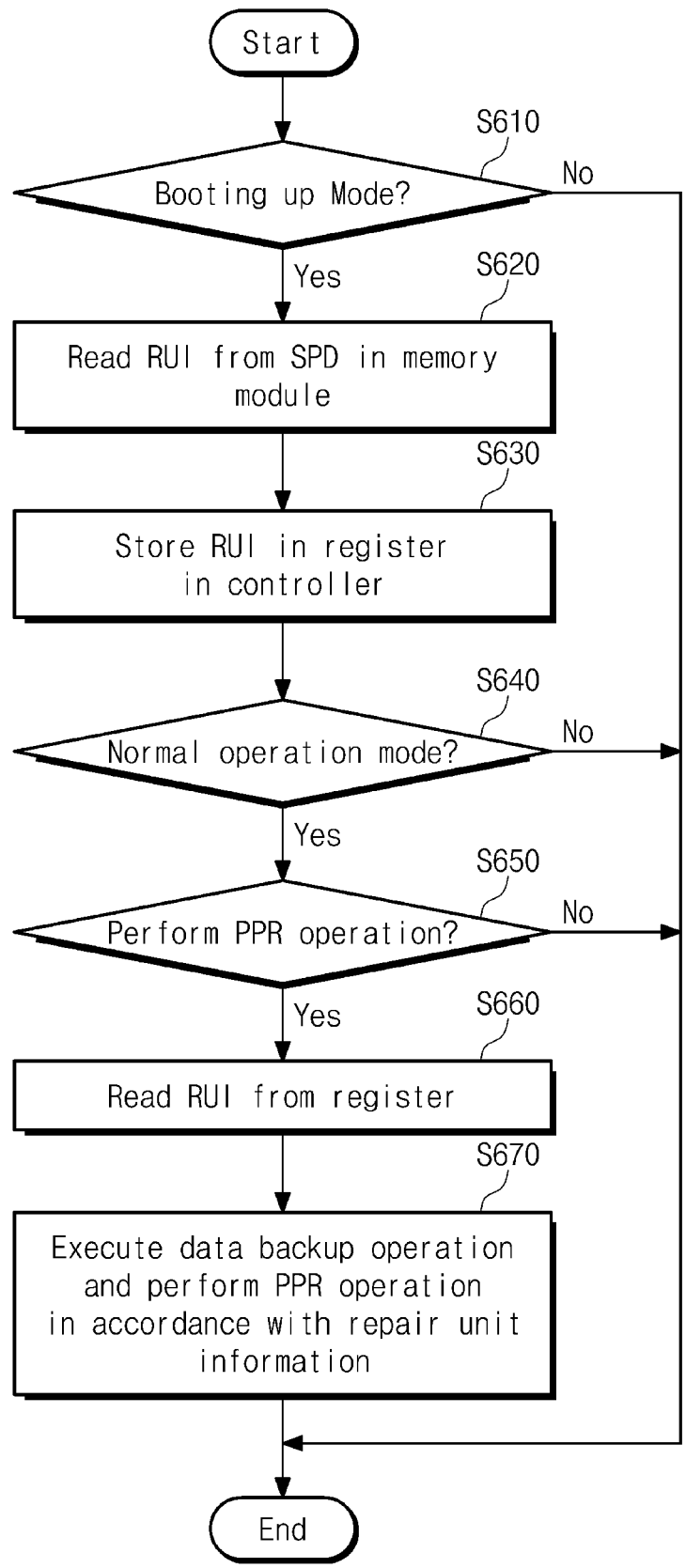
FIG. 6 is a flowchart illustrating a data backup operation of the controller of FIG. 4 according to exemplary embodiments of the inventive concept.

FIG. 6 is a flowchart illustrating a data backup operation of the controller of FIG. 4 according to an exemplary embodiment of the inventive concept. Referring to FIG. 6, in operation S610, the controller 200 determines whether the data system is in a booting up mode. The booting up mode may be performed when the data system is reset, powered on, or suddenly powered off. The booting up mode may accompany a training operation.

In operation S620, in the case where the data system is in the booting up mode, the controller 200 reads repair unit information from the memory module 101 of FIG. 4. For example, the controller 200 may read the repair unit information from the RUI area 132 in the SPD memory 140 loaded into the memory module 101.

In operation S630, the controller 200 stores the repair unit information read from the RUI area 132 in the register 220.

In operation S640, the controller 200 determines whether the data system is in the normal operation mode. The normal operation mode includes operation modes other than the booting up mode. For example, an operation of reading data from the memory module 101 or an operation of writing data in the memory module 101 may be included in the normal operation mode. The normal operation mode may include a standby operation of the memory module 101.

In the case where the data system is in the normal operation mode, in operation S650, the controller 200 determines whether to perform a post package repair (PPR) operation. The post package repair (PPR) operation may be performed when an uncorrectable read error occurs. That is, if an uncorrectable read error occurs, it may be determined to perform the post package repair (PPR) operation at operation S650. For example, in an exemplary scenario, if the number of read error bits is 4 or more when the number of error bits that can be corrected by an error correction code (ECC) is 3 bits, the read error cannot be corrected by the error correction code (ECC). When such an uncorrectable read error occurs, it is determined that the post package repair (PPR) operation is to be performed.

A data backup operation is performed before the post package repair (PPR) operation is performed. Thus, when it is determined that the post package repair (PPR) operation is to be performed, the controller 200 reads the repair unit information from the register 220 in operation S660, and executes the data backup operation and performs the post package repair (PPR) operation based on the repair unit information at operation S670. The data backup operation of the memory module 101 may be performed according to channels. In the case where the repair unit information is x4, the data backup operation of the memory module 101 may be performed on a per-4 word line basis. For example, in addition to repairing a word line that includes a defective memory cell, three adjacent word lines may also be repaired.

Figure 7:
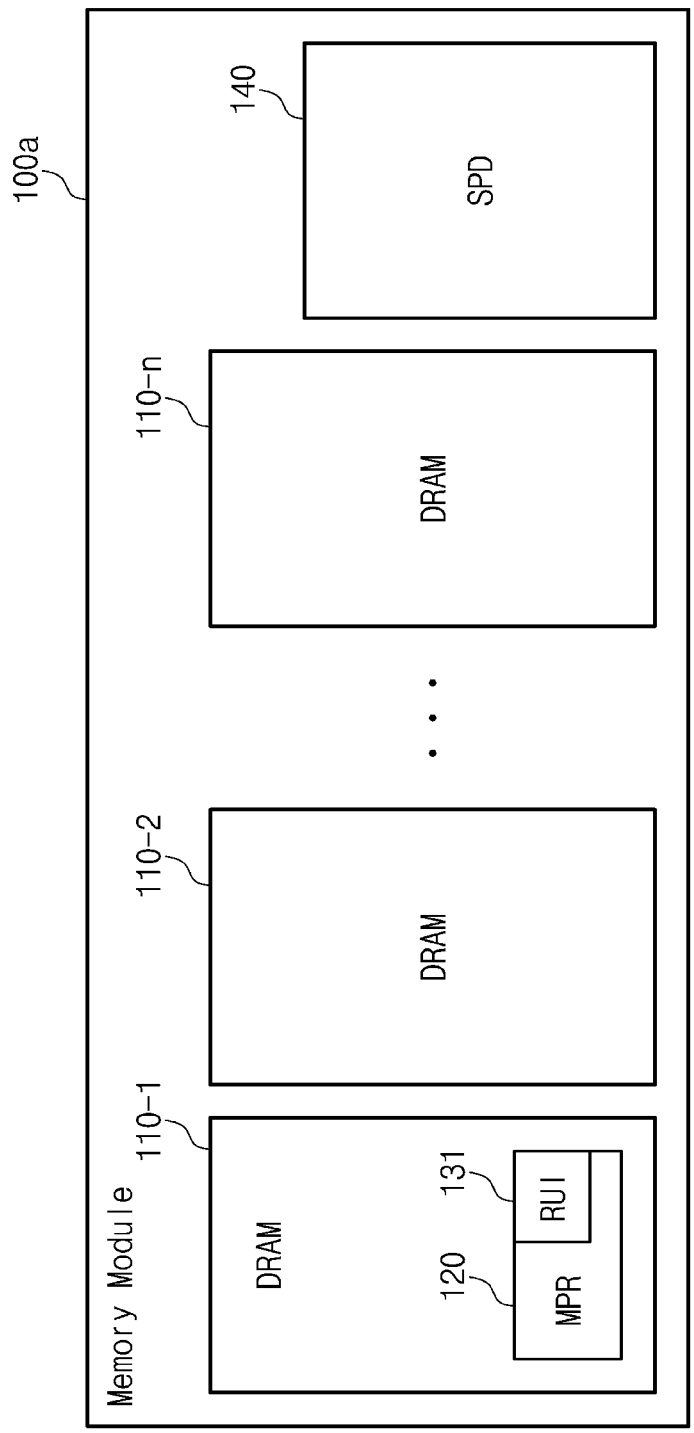
FIGS. 7 through 10 are block diagrams of memory modules applied to a data system according to exemplary embodiments of the inventive concept.

FIG. 7 is a block diagram of a memory module applied to a data system according to exemplary embodiments of the inventive concept.

Referring to FIG. 7, a memory module 100*a* may include a plurality of memory devices (110-1, 110-2, . . . , 110-*n*) and a serial presence detect (SPD) memory 140. Each of the plurality of memory devices (110-1, 110-2, . . . , 110-*n*) in the memory module 100*a* may be a DRAM. The DRAM (e.g., 110-1) may include a repair unit information area 131 in a multi-purpose register (MPR) 120. Repair unit information may be stored in the repair unit information area 131. The repair unit information may be used in a data backup operation that is performed before a post package repair (PPR) operation. The other DRAMs (110-2, 110-3, . . . , 110-*n*) may not include the repair unit information area 131. The SPD memory 140 does not include the repair unit information area 131. That is, in exemplary embodiments, the repair unit information area 131 may exist only in one DRAM in the memory module 100*a*. A plurality of DRAM chips loaded into the memory module 100*a* may be manufactured in the same repair manner. Thus, even in the case where the repair unit information area 131 exists in only one DRAM, exemplary embodiments of the inventive concept may be implemented.

Figure 8:
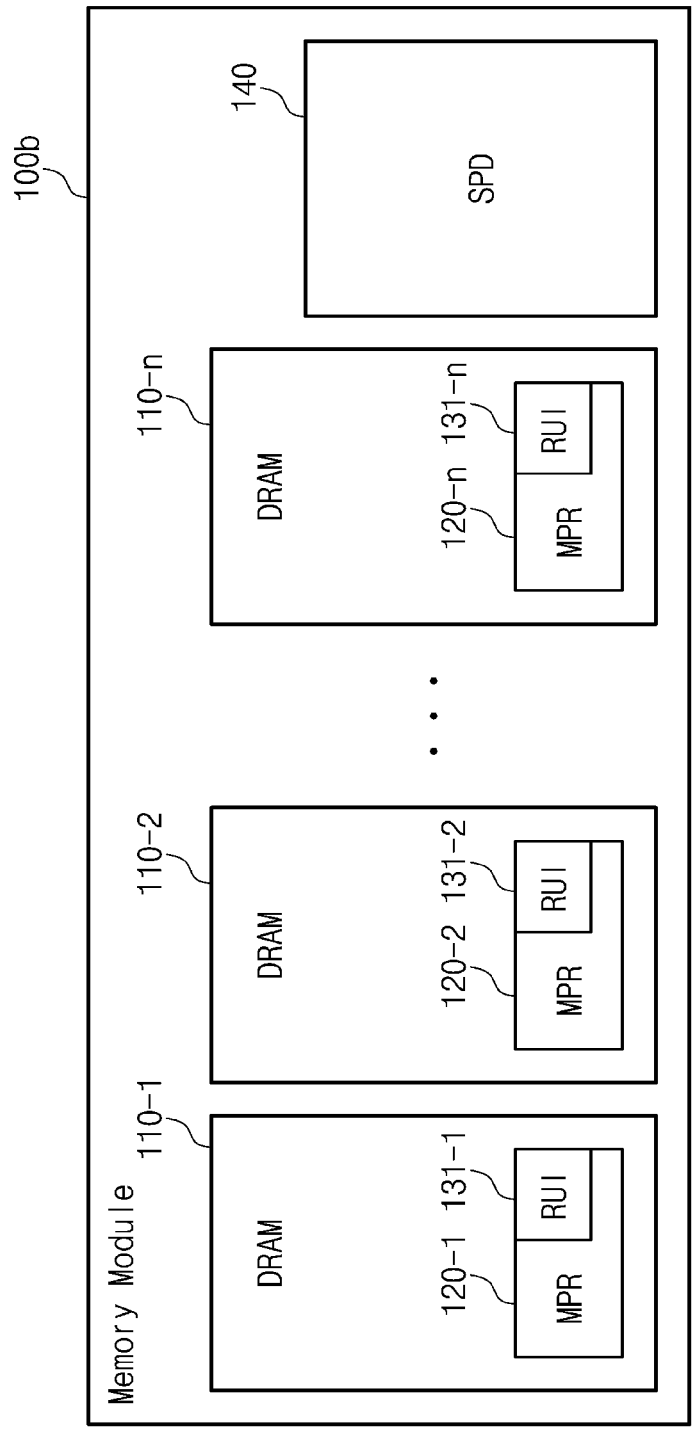

FIG. 8 is a block diagram of a memory module applied to a data system according to exemplary embodiments of the inventive concept.

Referring to FIG. 8, in a memory module 100*b*, unlike FIG. 7, DRAMs (110-1 to 110-*n*) include RUI areas (131-1 to 131-*n*) in the MPRs (120-1 to 120-*n*) respectively. In this case, even in the case where repair unit information is read from only one DRAM, exemplary embodiments of the inventive concept may be implemented. According to exemplary embodiments, the RUI areas (131-1 to 131-*n*) may be included in some or all of the DRAMs (110-1 to 110-*n*). For example, in an exemplary embodiment, the RUI areas (131-1 to 131-n) may be included in at least two of the DRAMs (110-1 to 110-n).

Figure 9:
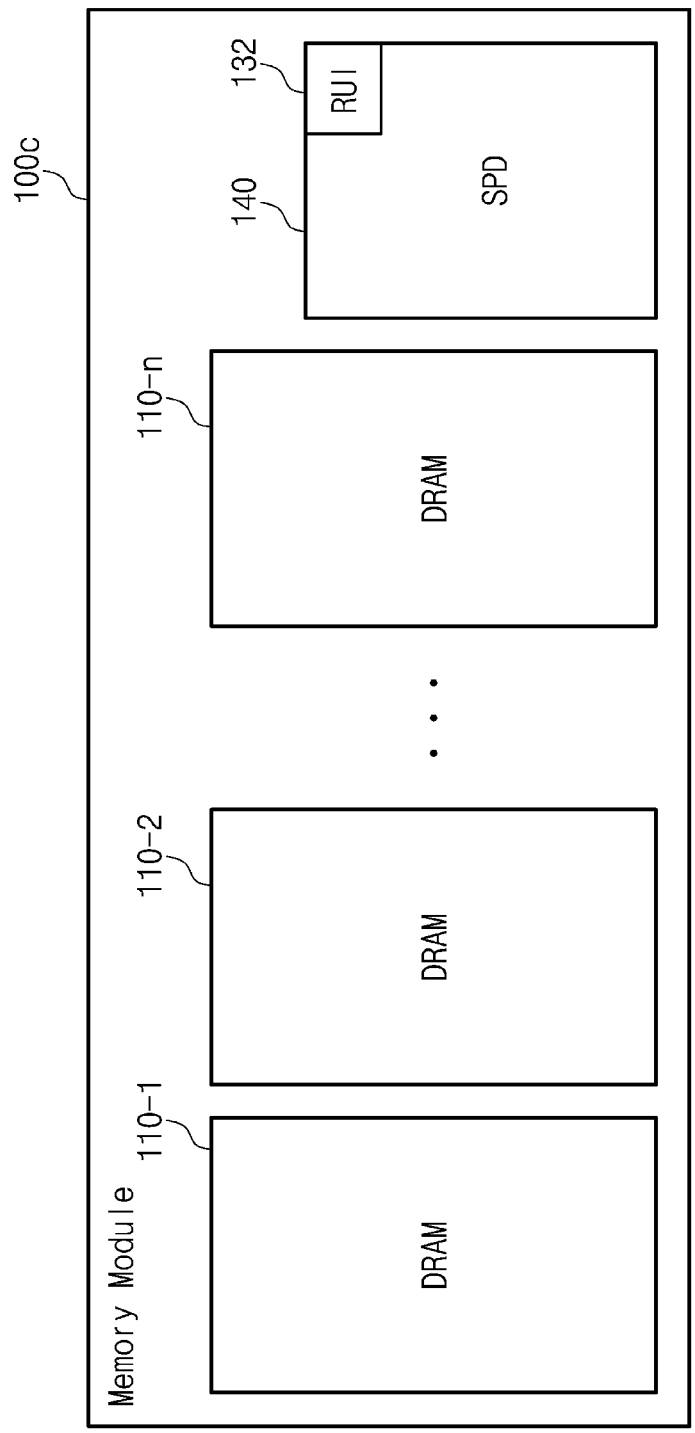

FIG. 9 is a block diagram of a memory module applied to a data system according to exemplary embodiments of the inventive concept.

Referring to FIG. 9, in a memory module 100c, DRAMs (110-1 to 110-n) do not include RUI areas, and a SPD memory 140 includes a RUI area 132. In this case, exemplary embodiments of the inventive concept may be implemented by reading repair unit information from the repair unit information area 132.

Figure 10:
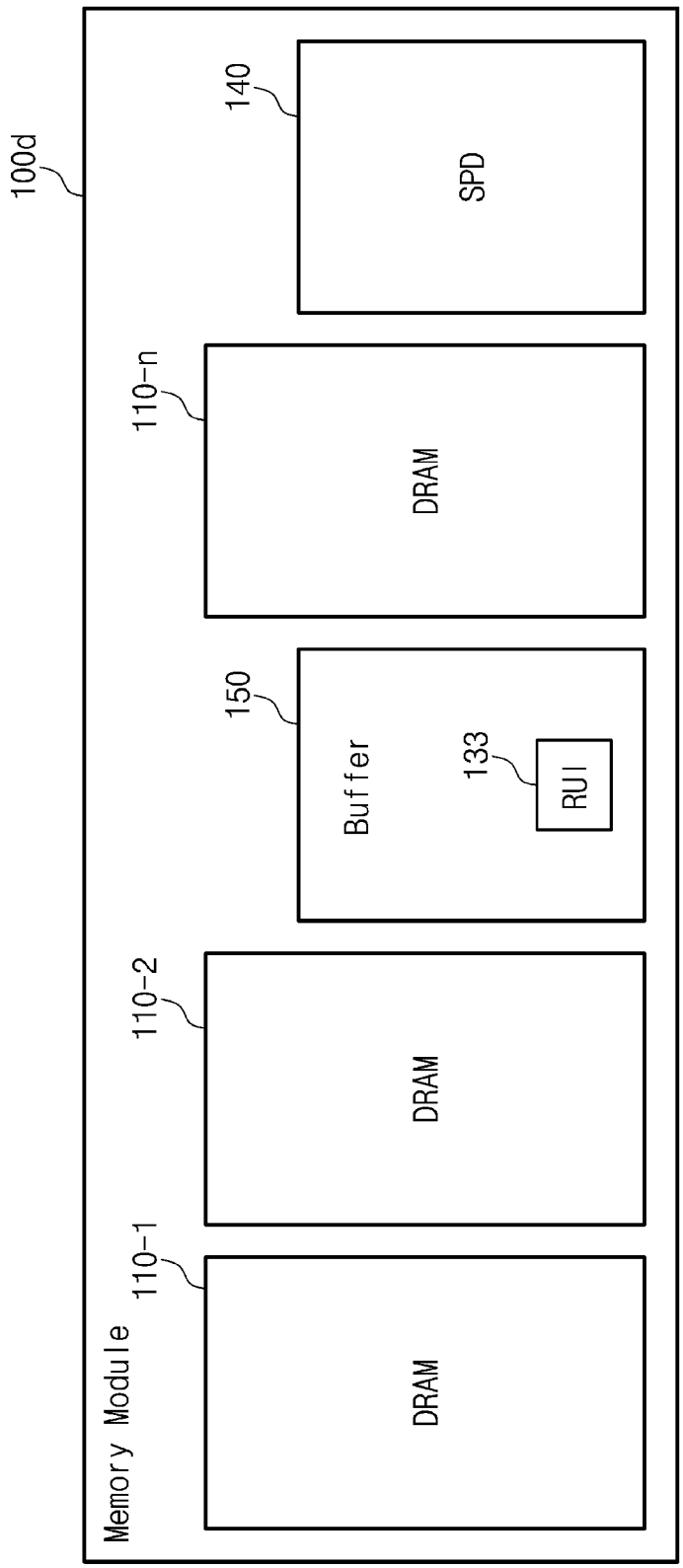

FIG. 10 is a block diagram of a memory module applied to a data system according to exemplary embodiments of the inventive concept.

Referring to FIG. 10, a memory module 100d may include a plurality of memory devices (110-1, 110-2, . . . , 110-n) and a serial presence detect (SPD) memory 140. The memory module 100d may include a buffer 150. The buffer 150 includes a repair unit information area 133. The plurality of memory devices (110-1, 110-2, . . . , 110-n) and the serial presence detect (SPD) memory 140 do not include a repair unit information area.

In this case, exemplary embodiments of the inventive concept may be implemented by reading repair unit information from the repair unit information area 133.

FIG. 11 is a view illustrating repair unit information used in a data backup operation according to exemplary embodiments of the inventive concept.

Referring to FIG. 11, an example where one channel CH1 includes three DIMMs (DIMM1, DIMM2, DIMM3) is illustrated. In the case where the three DIMMs (DIMM1, DIMM2, DIMM3) are equally repaired on a per-one word line basis (1WL) in one channel, a data backup unit may be 512 Byte. Thus, in this case, repair unit information may be given as data "01".

In the case where the three DIMMs (DIMM1, DIMM2, DIMM3) are repaired on a per-two word line basis (2WL) respectively in one channel, a data backup unit may be 1 Kbyte. Thus, in this case, the repair unit information may be given as data "10".

In the case where the three DIMMs (DIMM1, DIMM2, DIMM3) are repaired on a per-four word line basis (4WL) respectively in one channel, a data backup unit may be 2 Kbyte. Thus, in this case, the repair unit information may be given as data "11".

In the case where the two DIMMs (DIMM1, DIMM2) are repaired on a per-one word line basis (1WL) respectively or the DIMM3 is repaired on a per-two word line basis (2WL) in one channel, a data backup unit may be 1 Kbyte depending on the DIMM3. Thus, in this case, the repair unit information may be given as data "10".

In the case where the DIMM1 is repaired on a per-one word line basis (1WL), the DIMM2 is repaired on a per-two word line basis (2WL), and the DIMM3 is repaired on a per-four word line basis (4WL) in one channel, a data backup unit may be 2 Kbyte depending on the DIMM3. Thus, in this case, the repair unit information may be given as data "11".

Consequently, repair unit information having the largest value among the DIMMs (DIMM1, DIMM2, DIMM3) constituting one channel may be used in a data backup.

Figure 12:
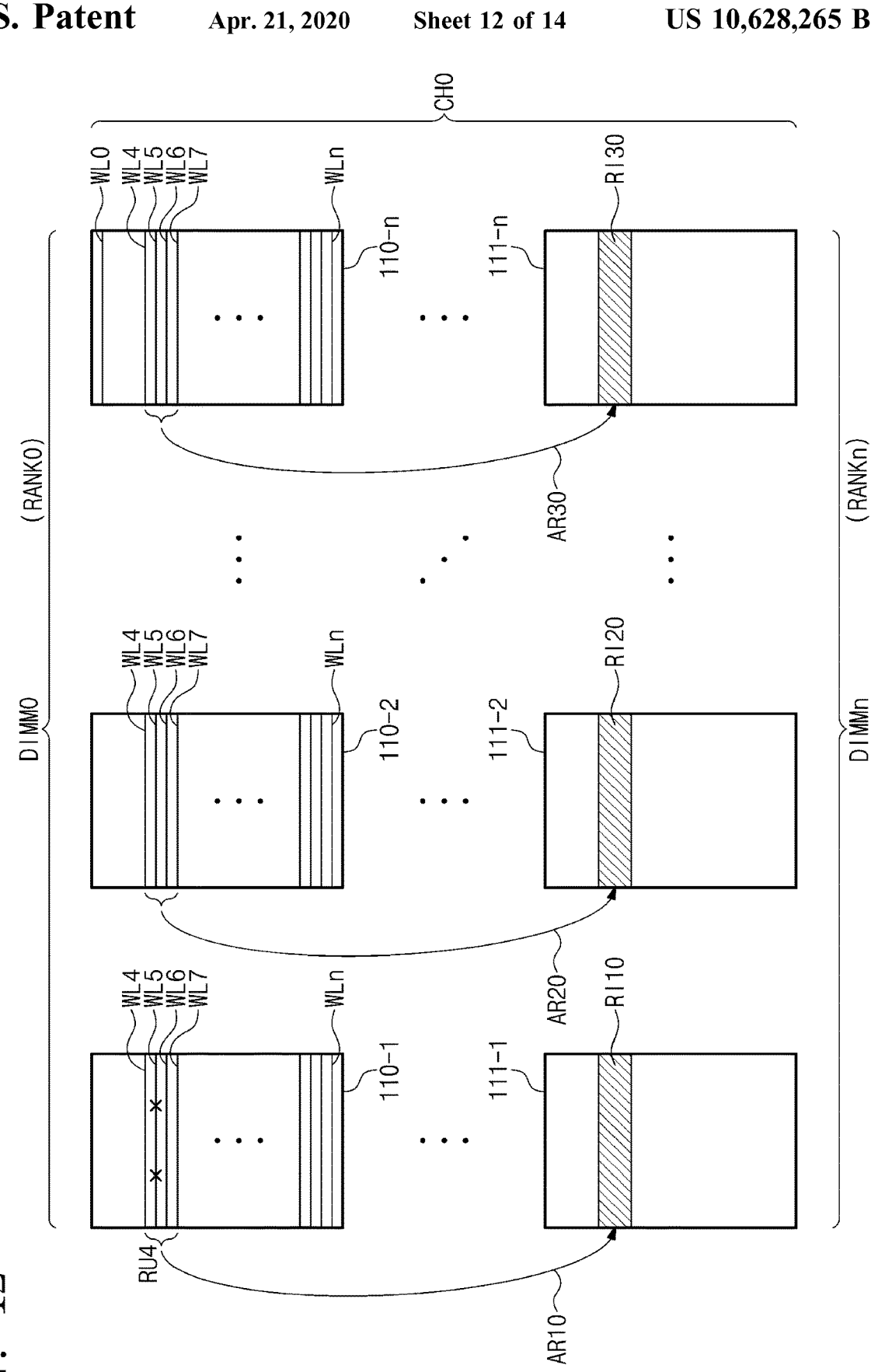
FIG. 12 is a view illustrating a data backup operation according to exemplary embodiments of the inventive concept.

FIG. 12 is a view illustrating a data backup operation according to exemplary embodiments of the inventive concept.

Referring to FIG. 12, a first channel CH0 includes a plurality of ranks (RANK0 to RANKn) and one rank (e.g., RANK0) is constituted by one DIMM (e.g., DIMM0). The DIMM0 includes a plurality of memory devices (110-1, 110-2, . . . , 110_n). Each of the plurality of memory devices (110-1, 110-2, . . . , 110_n) may be a DRAM.

Referring to an exemplary scenario for illustrative purposes, an uncorrectable read error occurs in an access operation of a sixth word line WL5 in the DRAM (110-1). In this case, data stored in word lines, including repair unit information, is backed up to a DRAM (111-1) of another DIMM (e.g., DIMMn). For example, in the case where the repair unit information is a four-word line unit RU4, data stored in memory cells connected to fifth through eighth word lines (WL4 to WL7) is backed up to a storage area RI10 of the DRAM (111-1) in the other DIMM, as indicated by arrow AR10. That is, in the case where the repair unit information is the four-word line unit RU4, data of four pages is moved to the storage area RI10 of the DRAM (111-1) in the other DIMM. Data of one page means data stored in memory cells connected to the same word line.

In exemplary embodiments, when a read operation for a data backup operation is performed on a per-bank basis, data of four pages in a DRAM (110-2) is moved to a storage area RI20 of a DRAM (111-2) in the other DIMM, as indicated by arrow AR20, while the data of four pages in the DRAM (110-1) is moved to the storage area RI10 of the DRAM (111-1) in the other DIMM. Data of four pages in a DRAM (110-n) is also moved to a storage area RI30 of a DRAM (111-n) in the other DIMM, as indicated by arrow AR30.

Since data of four pages is backed up on a per-rank basis while data of all pages in a DRAM is not backed up on a per-rank basis, a backup time is shortened.

In the case where the repair unit information is a two-word line unit, data of two pages is moved to the storage area RI10 of the DRAM (111-1) in the other DIMM. Data of two pages in the DRAM (110-2) is moved to the storage area RI20 of the DRAM (111-2) in the other DIMM, and data of two pages in the DRAM (110-n) is also moved to the storage area RI30 of the DRAM (111-n) in the other DIMM. Since data of two pages is backed up on a per-rank basis while data of all pages in a DRAM is not backed up on a per-rank basis, a backup time is shortened.

In FIG. 12, a backup operation is described with reference to a rank unit. However, exemplary embodiments of the inventive concept are not limited thereto. For example, a backup operation may be performed with reference to a memory device, a channel unit, or a DIMM unit.

Figure 13:
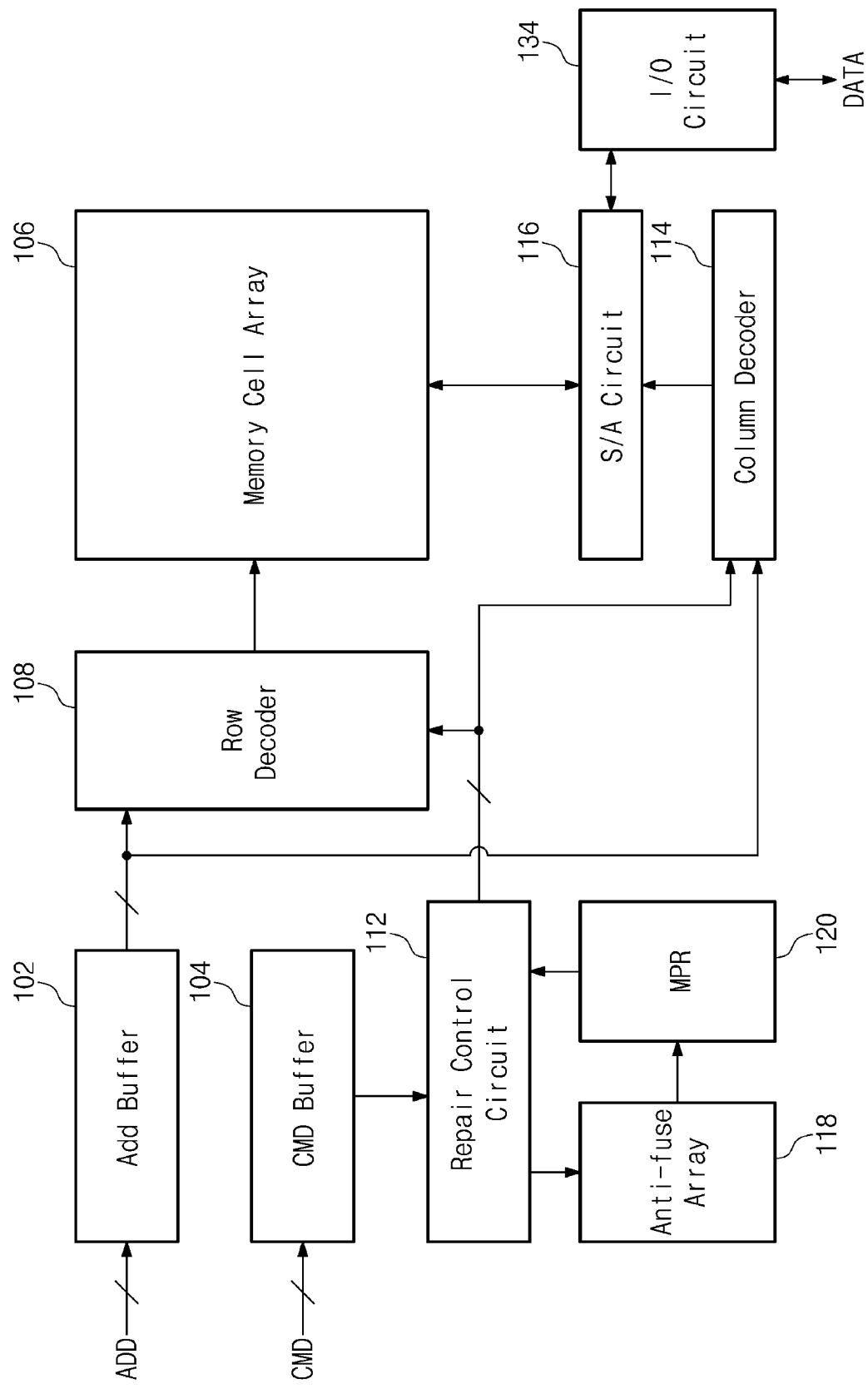
FIG. 13 is a block diagram of a memory device applied to a data system according to exemplary embodiments of the inventive concept.

FIG. 13 is a block diagram of a memory device applied to a data system according to exemplary embodiments of the inventive concept.

Referring to FIG. 13, a memory device may include an address buffer 102, a command buffer 104, a memory cell array 106, a row decoder 108, a repair control circuit 112, a column decoder 114, a sense amplifier circuit 116, an anti-fuse array 118, a multi-purpose register (MPR) 120, and an I/O circuit 134.

The address buffer 102 buffers an address ADD applied from a controller. A row address from among addresses ADD is applied to the row decoder 108. A column address from among addresses ADD is applied to the column decoder 114.

The command buffer 104 buffers a command CMD applied from the controller. The command CMD may include, for example, /RAS, /CAS, /WE, and /CS.

The memory cell array 106 may include DRAM memory cells. The memory cell array 106 may include a plurality of memory banks.

The row decoder 108 selects a word line of the memory cell array 106 in response to a row address.

The repair control circuit 112 controls a repair operation of memory cells.

The column decoder 114 selects a column of the memory cell array 106 in response to a column address. A column of the memory cell array 106 is connected to a bit line.

The sense amplifier circuit 116 senses and amplifies data stored in DRAM memory cells.

The anti-fuse array 118 includes a plurality of anti-fuses. The anti-fuses may be used to store repair unit information according to exemplary embodiments of the inventive concept.

The multi-purpose register (MPR) 120 is a static storage device that stores DRAM information. The DRAM information may include one of a read data pattern, a write data pattern, an error log, and a mode register set. A repair unit information area may be included in the multi-purpose register (MPR) 120. Repair unit information read from the anti-fuse array 118 is stored in the repair unit information area. In an exemplary embodiment, in the case where the multi-purpose register (MPR) 120 is constituted by pages 0 through 3, the repair unit information may be stored in the page 3.

The I/O circuit 134 outputs data read from the memory cell array 106 and receives write data provided from the controller.

In a booting up mode or training mode of the data system, the repair unit information stored in the anti-fuse array 118 is stored in a RUI area (e.g., RUI area 131 of FIG. 2) in the multi-purpose register (MPR) 120 under the control of the repair control circuit 112. In a booting up mode or training mode of the data system, the repair unit information stored in the RUI area (e.g., RUI area 131 of FIG. 2) is output to the controller through the I/O circuit 134. The controller stores the repair unit information in an internal memory (e.g., the register 220 of FIG. 1).

A data backup operation used for a post package repair (PPR) operation is performed by the controller 200.

In an exemplary embodiment, the repair control circuit 112 may independently perform a data backup operation for a post package repair (PPR) operation. To this end, a pattern generator may be included in a DRAM chip. The pattern generator operates according to a sequence set in synchronization with a clock. Thus, the backup operation may be performed without utilizing a separate command. An address counter and a buffer for a data backup operation may be included in the DRAM chip. When performing a data backup operation for a post package repair (PPR) operation, the controller 200 provides only a backup start signal utilizing extended mode register set (EMRS). Thus, a DRAM autonomously backs up data to be backed up to the buffer.

In exemplary embodiments, in a backup operation, a row address of a defective word line is latched. A row address to be backed up is generated using the latched row address and the repair unit information. For example, if the row address selecting the defective word line is latched and the repair unit information is 4, a total of four row addresses including the latched row address may be generated.

Figure 14:
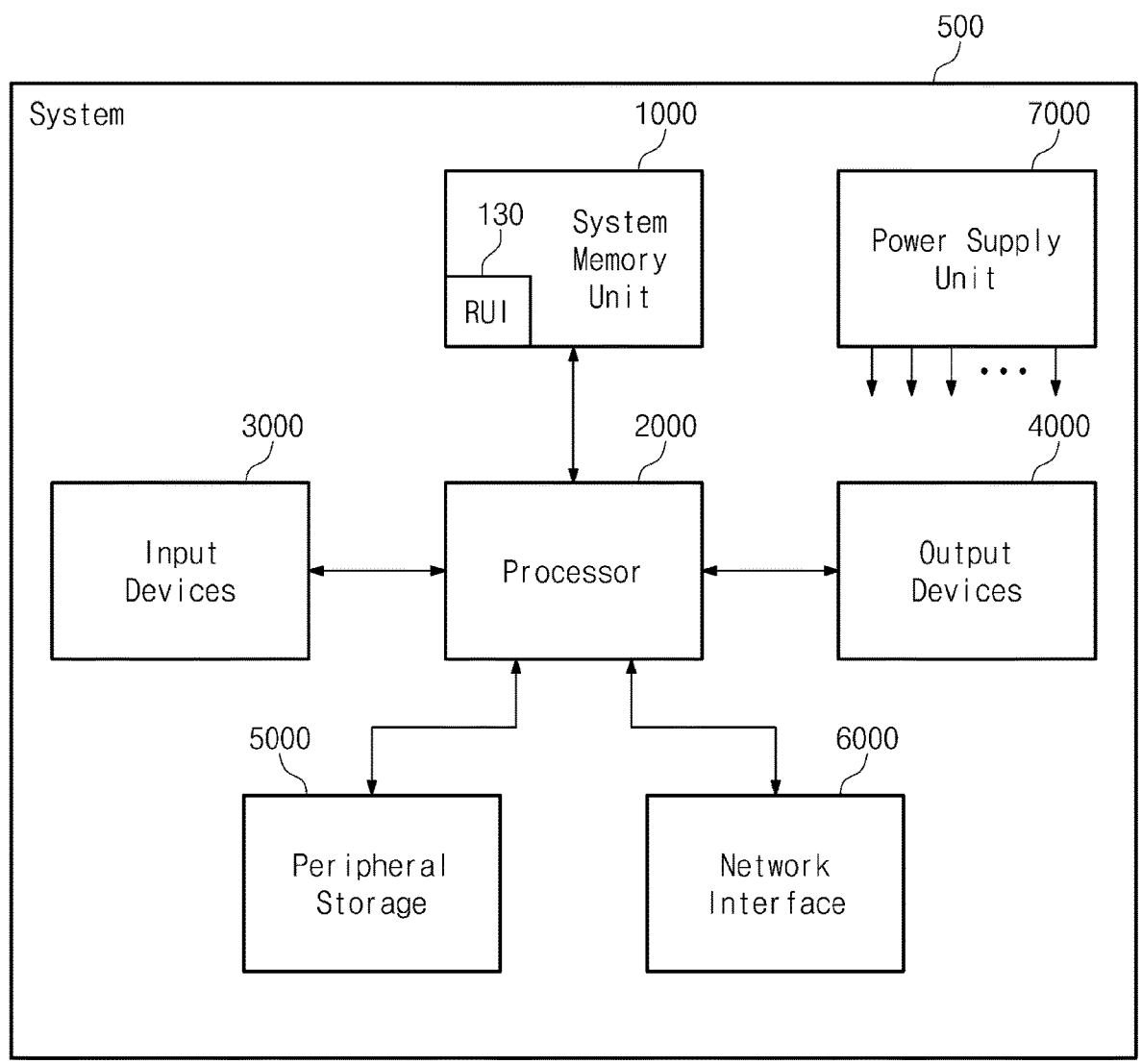
FIG. 14 is a block diagram of an electronic device including a data system according to exemplary embodiments of the inventive concept.

FIG. 14 is a block diagram of an electronic device including a data system according to exemplary embodiments of the inventive concept.

Herein, the terms "unit", "module", and "circuit" may be used interchangeably, and such components may be embodied in software, hardware, or combinations thereof.

Referring to FIG. 14, an electronic system 500 may include a system memory unit 1000, a processor 2000, input devices 3000, output devices 4000, peripheral storage 5000, a network interface 6000, and a power supply unit 7000.

The electronic system 500 may be embodied in the form of a portable communication terminal, a PDA (personal digital assistant), a PMP (portable media player), a smartphone, or a wearable device. The electronic system 500 may be embodied in the form of a computing system such as a personal computer, a server, a workstation, a notebook computer, etc.

In the electronic system 500, the system memory unit 1000 may include the memory module 100 described in FIG. 1 or the memory module 101 described in FIG. 4. The system memory unit 1000 may include a repair unit information area 130.

The processor 2000 may include the controller 200 described in FIG. 1 or 4. The processor 2000 may execute applications providing an Internet browser, a game, a video, etc. The processor 2000 may include a single core or multiple cores. For example, the processor 2000 may include a multi-core such as a dual-core, a quad-core, a hexa-core, etc. The processor 2000 may further include an internal or external cache memory.

The system memory unit 1000 and the processor 2000 may constitute a data system such as the system described with reference to FIG. 1 or 4. The processor 2000 may provide a MPR read command to the system memory unit 1000 during an initial power-up period. The system memory unit 1000 may provide repair unit information to the processor 2000 in response to the MPR read command.

In exemplary embodiments, in the case where the data system is in a normal operation mode, the processor 2000 may determine whether to perform a post package repair (PPR) operation. For example, in the case where a read error cannot be corrected using an error correction code (ECC), the post package repair (PPR) operation is performed. To perform a data backup operation, the processor 2000 reads repair unit information from the RUI area 130. The processor 2000 partially performs a data backup operation based on the repair unit information. Thus, in the partial data backup operation, a backup time is shortened as compared with an operation of backing up the entirety of the data.

The input devices 3000 may include, for example, at least one of a keypad, a touch screen, and a microphone.

The output devices 4000 may include, for example, at least one of a speaker and a display device.

The peripheral storage 5000 may include, for example, at least one of a memory card, a solid state drive (SSD), a hard disk drive (HDD), and a CD-ROM.

The network interface 6000 may perform wireless communication or wired communication with an external device. For example, the network interface 6000 may perform at least one of an Ethernet communication, a near field communication (NFC), a radio frequency identification (RFID) communication, a mobile telecommunication, a memory card communication, and a universal serial bus (USB) communication. For example, the network interface 6000 may include a baseband chip set and may support a communication such as GSM, GPRS, WDCMA, HSxPA.

The power supply unit 7000 may receive battery power or other power being applied to generate an operation voltage of the electronic system 500.

According to exemplary embodiments of the inventive concept, the time taken to perform a data backup operation that occurs before a post package repair (PPR) operation may be shortened.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A data backup method, comprising:
reading repair unit information of a memory device;
storing the repair unit information in a register;
determining whether to perform a post package repair (PPR) operation in response to a read error occurring while the memory device is being accessed; and
performing a data backup operation of the memory device based on the repair unit information in response to determining that the post package repair operation is to be performed,
wherein the repair unit information indicates a number of word lines of the memory device being repaired by the PPR operation, and is previously stored as bit data in the memory device for the same use in the data backup operation,
wherein the data backup operation is performed on an at least one word line basis corresponding to the number of word lines.

2. The data backup method of claim 1, wherein reading the repair unit information is performed during a training mode of the memory device.

3. The data backup method of claim 1, wherein the register is disposed in a memory controller that is separate from the memory device.

4. The data backup method of claim 1, wherein the repair unit information is stored in a multi-purpose register of the memory device.

5. The data backup method of claim 1, wherein the memory device is mounted on a memory module, and the repair unit information is stored in a serial presence detect (SPD) memory device mounted on the memory module.

6. The data backup method of claim 1, wherein the memory device is one of a plurality of memory devices mounted on a memory module, and the repair unit information is stored in one of the plurality of memory devices mounted on the memory module.

7. The data backup method of claim 6, wherein the data backup operation of the memory device comprises:
finding a row address of the memory device in which the read error occurs;
reading data of memory cells corresponding to backup unit row addresses to which the row address belongs; and
storing the read data in a memory device belonging to a different channel than a channel to which the memory device in which the read error occurs belongs.

8. The data backup method of claim 6, wherein the data backup operation of the memory device is partially performed on a per-channel basis directed at all memory devices that belong to a same channel.

9. The data backup method of claim 1, wherein the read error occurring while the memory device is being accessed is not correctable using an error correction code (ECC).

10. A data backup method, comprising:
reading repair unit information of a memory device during a booting up mode of a data system;
storing the repair unit information in a memory in a controller;
determining whether a read error occurring while the memory device is being accessed is correctable using an error correction code (ECC); and
performing a data backup operation of the memory device on a per-channel basis based on the repair unit information stored in the memory in response to determining that the read error occurring while the memory device is being accessed is not correctable using the ECC,
wherein the repair unit information indicates a number of word lines of the memory device being repaired by a post package repair (PPR) operation, and is previously stored as bit data in the memory device for the same use in the data backup operation,
wherein the data backup operation is performed on an at least one word line basis corresponding to the number of word lines.

11. The data backup method of claim 10, further comprising:
performing the PPR operation after the data backup operation of the memory device has been completed.

12. The data backup method of claim 10, wherein the data backup operation of the memory device comprises:
finding a row address of the memory device in which the read error occurs;
accessing memory cells corresponding to backup unit row addresses to which the row address belongs;
reading data stored in the memory cells; and
storing the read data in a memory device different than the memory device in which the read error occurs.

13. The data backup method of claim 10, wherein the memory device is one of a plurality of memory devices disposed in a memory module, and the repair unit information is stored in at least two of the plurality of memory devices.

14. The data backup method of claim 13, wherein the repair unit information is stored in a buffer memory disposed in the memory module.

15. A data backup method, comprising:
reading repair unit information of a memory device;
storing the repair unit information in a register;
determining whether a read error occurring while the memory device is being accessed is correctable using an error correction code (ECC); and
performing a data backup operation of the memory device based on the repair unit information in response to determining that the read error occurring while the memory device is being accessed is not correctable using the ECC,
wherein the repair unit information indicates a number of word lines of the memory device being repaired by a post package repair (PPR) operation, and is previously stored as bit data in the memory device for the same use in the data backup operation,
wherein the data backup operation is performed on an at least one word line basis corresponding to the number of word lines.

16. The data backup method of claim 15, further comprising:
performing the PPR operation after the data backup operation of the memory device has been completed.

17. The data backup method of claim 15, wherein reading the repair unit information is performed during a training mode of the memory device.

18. The data backup method of claim 15, wherein the register is disposed in a memory controller that is separate from the memory device.

\* \* \* \* \*